(12) United States Patent
Kim et al.

(10) Patent No.: US 9,962,926 B2
(45) Date of Patent: May 8, 2018

(54) METHOD OF CORRECTING A SCREEN PRINTER AND A BOARD INSPECTION SYSTEM USING THE SAME

(71) Applicants: KOH YOUNG TECHNOLOGY INC., Seoul (KR); KYUNGPOOK NATIONAL UNIVERSITY INDUSTRY ACADEMIC COOPERATION FOUNDATION, Daegu (KR)

(72) Inventors: Min-Young Kim, Daegu (KR); Min-Su Kim, Seoul (KR); Ja-Geun Kim, Seoul (KR)

(73) Assignees: KOH YOUNG TECHNOLOGY INC., Seoul (KR); KYUNGPOOK NATIONAL UNIVERSITY INDUSTRY-ACADEMIC COOPERATION FOUNDATION, Daegu (KR)

( * ) Notice: Subject to any disclaimer, the term of this patent is extended or adjusted under 35 U.S.C. 154(b) by 0 days. days.

(21) Appl. No.: 14/396,545

(22) PCT Filed: Apr. 29, 2013

(86) PCT No.: PCT/KR2013/003668
§ 371 (c)(1),
(2) Date: Oct. 23, 2014

(87) PCT Pub. No.: WO2013/162341
PCT Pub. Date: Oct. 31, 2013

(65) Prior Publication Data
US 2015/0210064 A1    Jul. 30, 2015

(30) Foreign Application Priority Data
Apr. 27, 2012 (KR) .................. 10-2012-0044894
Apr. 26, 2013 (KR) .................. 10-2013-0046538

(51) Int. Cl.
*B41F 15/08* (2006.01)
*B41F 33/00* (2006.01)
(Continued)

(52) U.S. Cl.
CPC .............. *B41F 33/00* (2013.01); *B41F 15/08* (2013.01); *B41F 15/14* (2013.01); *H05K 3/0008* (2013.01);
(Continued)

(58) Field of Classification Search
None
See application file for complete search history.

(56) References Cited

U.S. PATENT DOCUMENTS 4,440,080 A * 4/1984 Lyall .............................. 101/129
4,981,074 A * 1/1991 Machita et al. ................ 101/35
(Continued)

FOREIGN PATENT DOCUMENTS

| JP | 6-27032 | 2/1994 |
| JP | 8-2085 | 1/1996 |

(Continued)

OTHER PUBLICATIONS

International Search Report for International Application No. PCT/KR2013/003668, dated Jul. 18, 2013.
(Continued)

*Primary Examiner* — Jill Culler
(74) *Attorney, Agent, or Firm* — Kile Park Reed & Houtteman PLLC

(57) ABSTRACT

The present invention relates to a method of correcting a position of a stencil mask which comprises receiving fiducial information from a screen printer, extracting position information of a pad and position information of a solder formed on a board through measuring by a solder paste inspection apparatus, estimating an x, y offset value and a
(Continued)

rotating amount of a stencil mask based on the fiducial information by using the position information of the pad and the solder, and transmitting the x,y offset value and the rotating amount of the stencil mask to the screen printer. Thus, a reliability of solder forming process may be increased by correcting a stencil mask position by transmitting a feedback of an x,y offset value and a rotating amount of the stencil mask from a solder paste inspection apparatus, in which the x,y offset value and the rotating amount are estimated based on fiducial information transmitted from the screen printer.

6 Claims, 7 Drawing Sheets

(51) Int. Cl.
  *B41F 15/14* (2006.01)
  *H05K 3/34* (2006.01)
  *H05K 3/00* (2006.01)
  *B41F 15/12* (2006.01)
  *B41M 1/12* (2006.01)
  *H05K 3/12* (2006.01)
  *H05K 1/02* (2006.01)

(52) U.S. Cl.
  CPC .............. *H05K 3/34* (2013.01); *B41F 15/12* (2013.01); *B41F 33/0036* (2013.01); *B41F 33/0081* (2013.01); *B41M 1/12* (2013.01); *H05K 1/0269* (2013.01); *H05K 3/1216* (2013.01); *H05K 3/3484* (2013.01); *H05K 2201/09918* (2013.01)

(56) References Cited

U.S. PATENT DOCUMENTS

| | | | | |
|---|---|---|---|---|
| 5,163,012 A | * | 11/1992 | Wuhrl et al. | 382/112 |
| 5,592,877 A | * | 1/1997 | Szyszko et al. | 101/129 |
| 5,740,729 A | * | 4/1998 | Hikita et al. | 101/126 |
| 5,912,984 A | * | 6/1999 | Michael et al. | 382/149 |
| 6,011,629 A | * | 1/2000 | Ootake et al. | 356/400 |

FOREIGN PATENT DOCUMENTS

| | | |
|---|---|---|
| JP | 11-986 | 1/1999 |
| JP | 11-138746 | 5/1999 |
| JP | 3071569 | 5/2000 |
| JP | 2000-200355 | 7/2000 |
| JP | 2000-233488 | 8/2000 |
| JP | 2000-263749 | 9/2000 |
| JP | 2001-7496 | 1/2001 |
| JP | 2002-29027 | 1/2002 |
| JP | 2003-94613 | 4/2003 |
| JP | 2003-159778 | 6/2003 |
| JP | 2004-79783 | 3/2004 |
| JP | 2004-330690 | 11/2004 |
| JP | 2006-5238 | 1/2006 |
| JP | 2006-86323 | 3/2006 |
| JP | 2006-305779 | 11/2006 |
| JP | 2007-184497 | 7/2007 |
| JP | 2008-307830 | 12/2008 |
| JP | 2009-92557 | 4/2009 |
| KR | 20-0236121 | 10/2001 |
| WO | 2007/092325 | 8/2007 |

OTHER PUBLICATIONS

Written Opinion of the International Searching Authority for International Application No. PCT/KR2013/003668, dated Jul. 18, 2013.

* cited by examiner

【Figure 1】
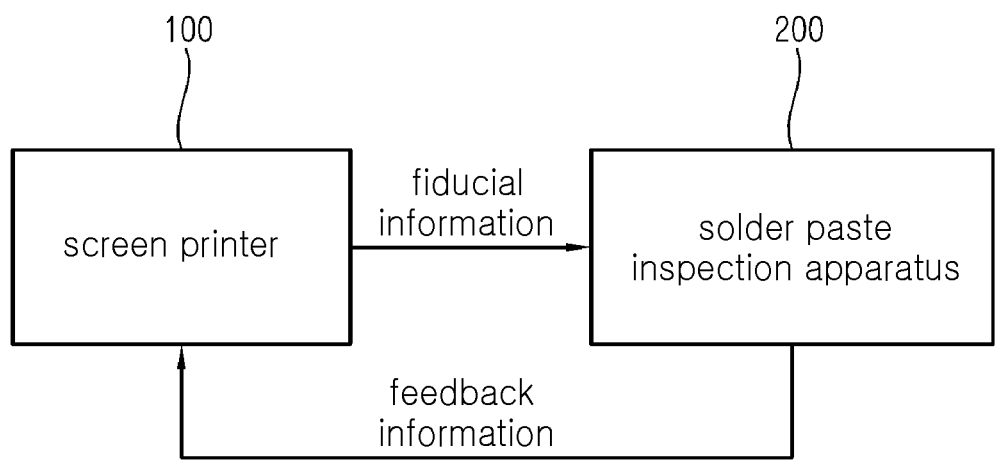

[Figure 2]
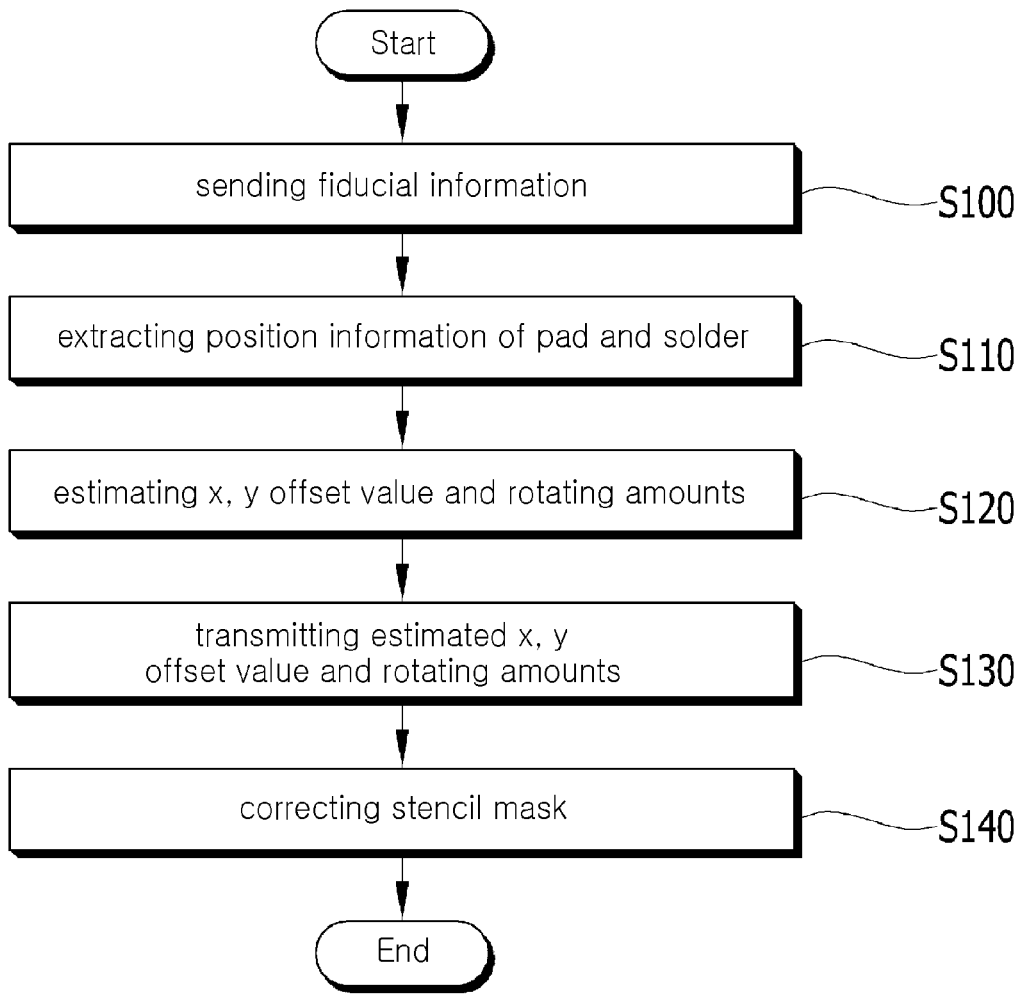

【Figure 3】
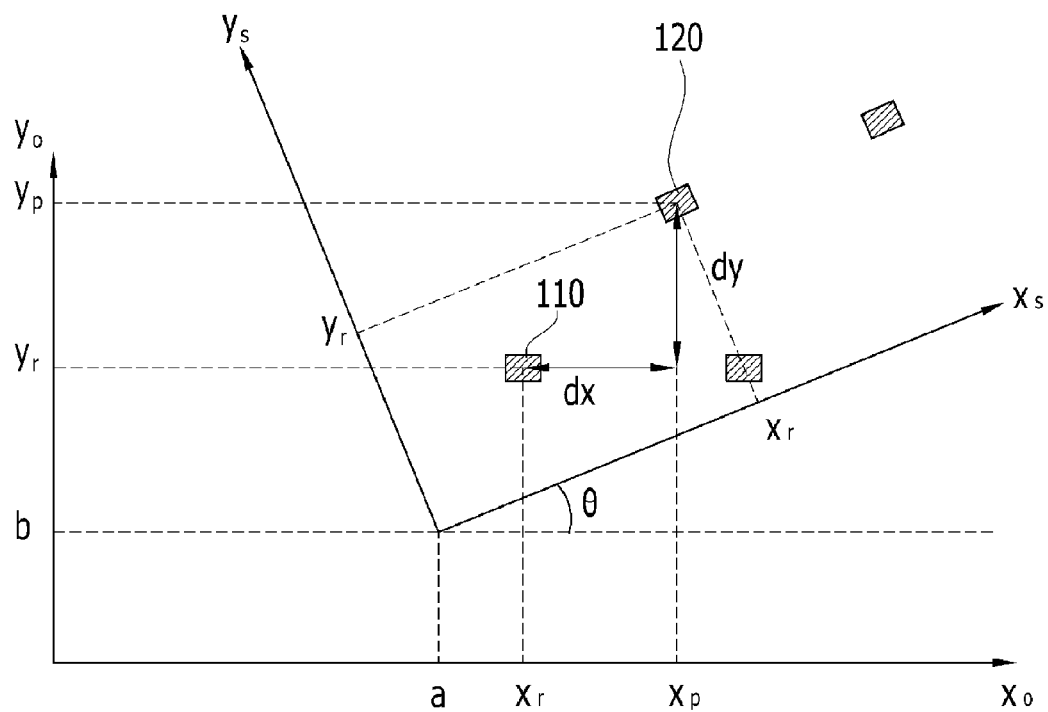

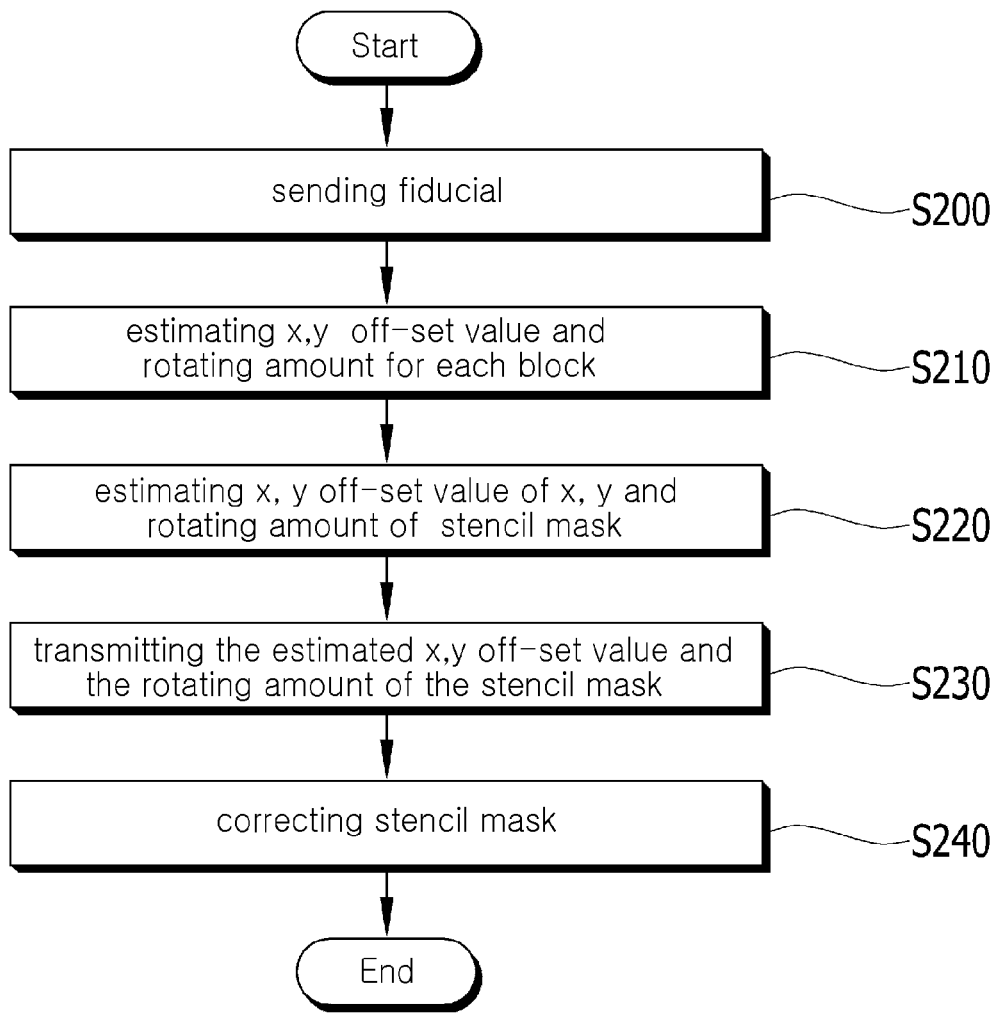

【Figure 5】
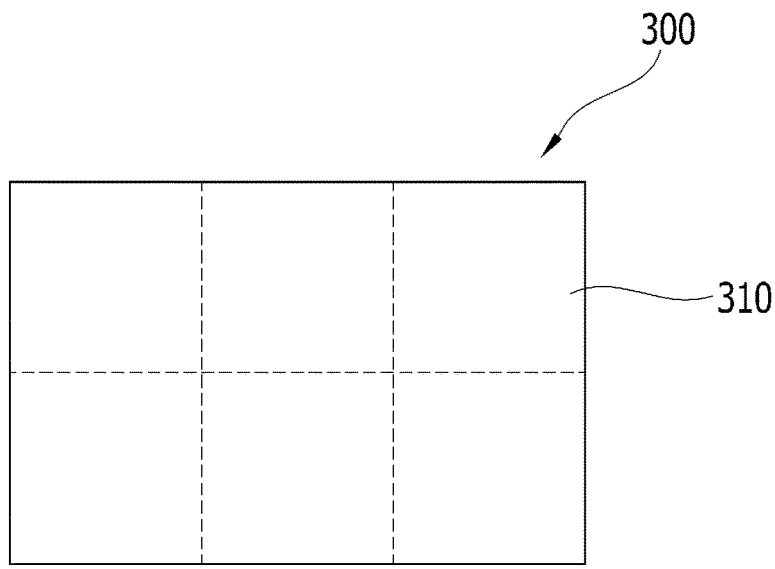
【Figure 6】
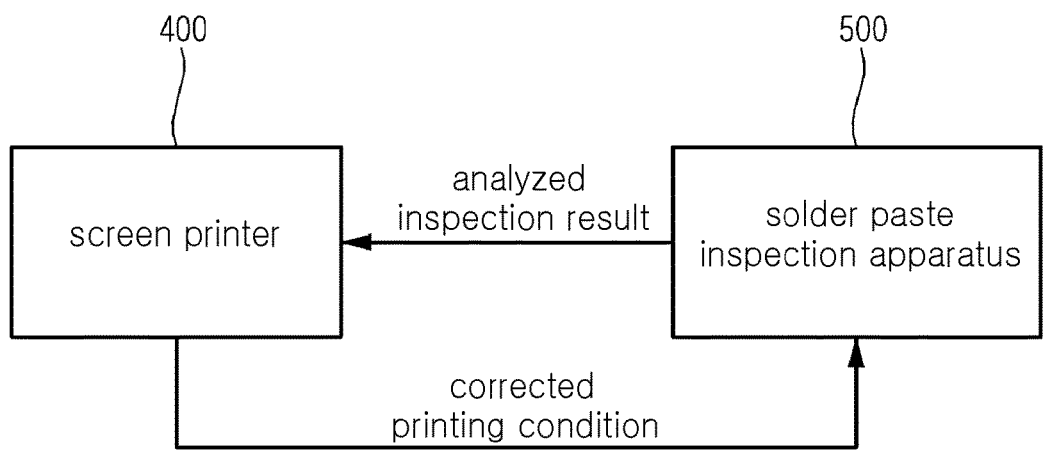

[Figure 7]
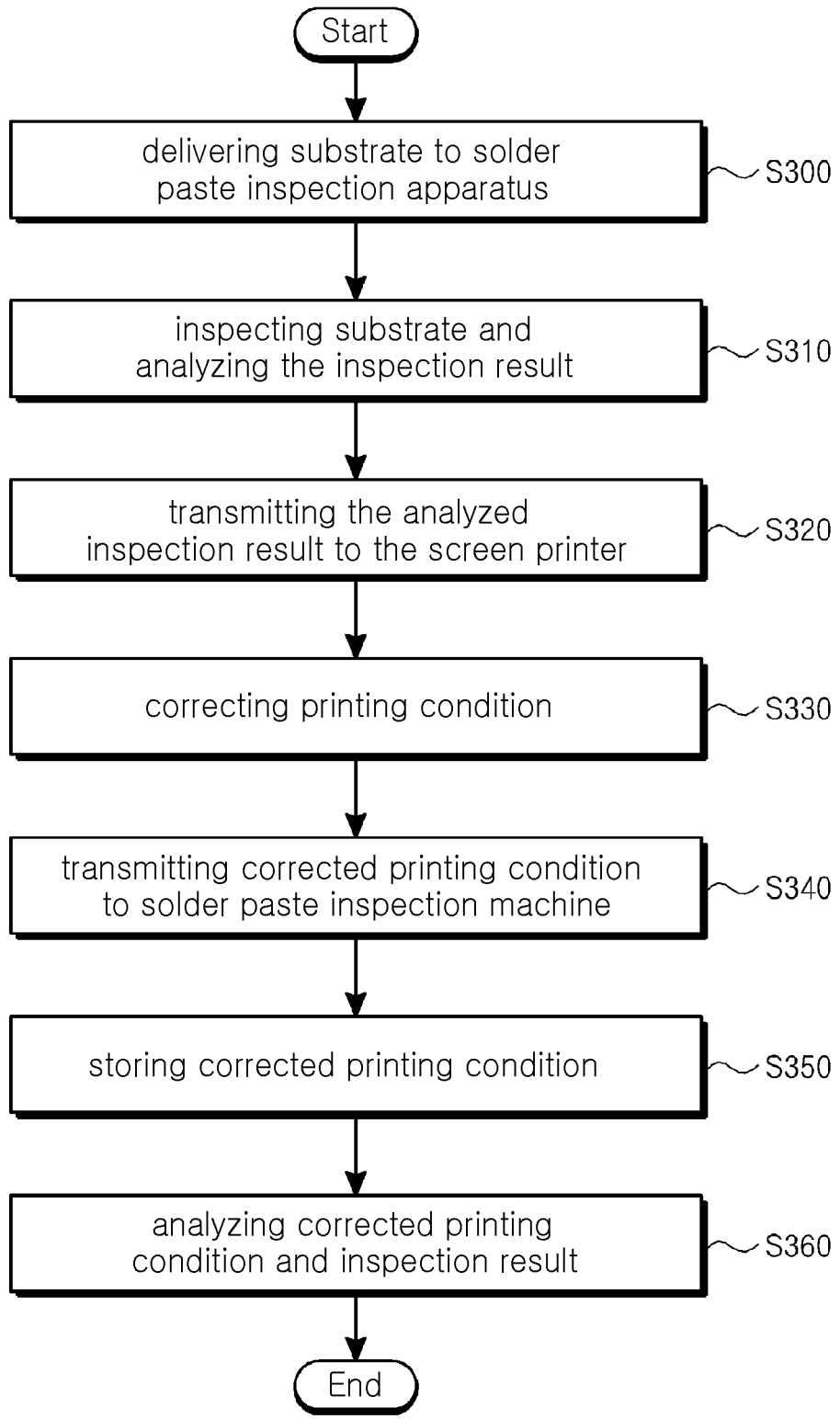

[Figure 8]
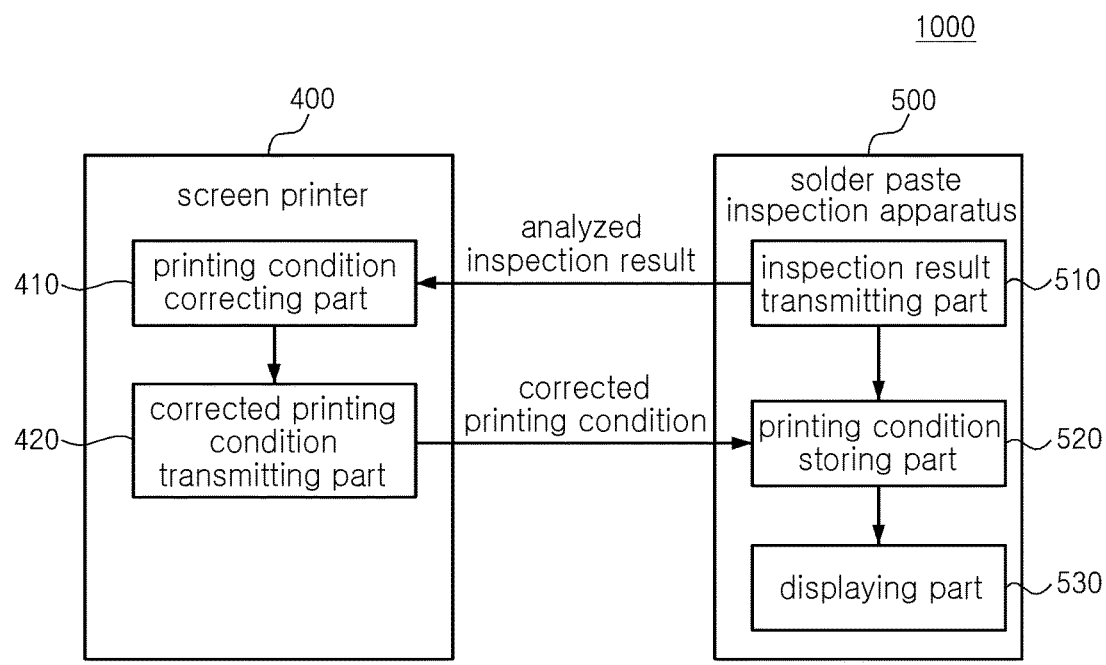

METHOD OF CORRECTING A SCREEN PRINTER AND A BOARD INSPECTION SYSTEM USING THE SAME

TECHNICAL FIELD

Exemplary embodiments of the present invention relate to a method of correcting a screen printer and a board inspection system using the same. More particularly, exemplary embodiments of the present invention relate to a screen printer which forms a solder on a board, a method of correcting a screen printer by using communication between a solder paste inspection apparatus which inspects a solder formed on a board, and a board inspection system using the same.

BACKGROUND ART

In general, in order to mount an electronic component on a printed circuit board, first, a solder is formed on a pad of a printed circuit board through a screen printer. Next, a solder forming state is inspected by a solder paste inspection (SPI) apparatus, and then, an electronic component is mounted through surface mount technology (SMT).

Herein, a solder is formed on a pad of a printed circuit board by forming a solder on a stencil mask, which is disposed above a printed circuit board and has an opening formed on an area corresponding to a pad position formed on printed circuit board, through a screen printer.

However, during process of printing a solder through a screen printer, a position error of a printed solder is actually generated by a misalignment of stencil mask, a mismatch between coordinate of fiducial mark camera which is inside screen printer and corrected coordinate of mask or board, etc, and therefore, a reliability of mounting process of electronic component is reduced.

DISCLOSURE

Technical Problem

Therefore, the technical problem of the present invention is to provide a method of correcting a screen printer to improve a reliability of screen printing process by transmitting a feedback of an offset value and rotating amount of a stencil mask to a screen printer through a solder paste inspection apparatus.

Also, a method of correcting a screen printer capable of statistical analysis of a printing condition change and a changed printed board by receiving a correcting printing condition of screen printer, from a solder paste inspection apparatus by using the inspection result is provided.

Also, a board inspection system capable of statistical analysis of a printing condition change and a changed printed board by receiving a corrected printing condition of screen printer, from a solder paste inspection apparatus by using the inspection result is provided.

Technical Solution

In one embodiment of the present invention, a method correcting a screen printer comprises receiving fiducial information from a screen printer, extracting position information of a pad formed on a board and position information of a solder through measuring by a solder paste inspection apparatus, estimating an x,y offset value and a rotating amount of a stencil mask based on the fiducial information by using the position information of the pad and the solder, and transmitting the x, y offset value and the rotating amount of the stencil mask to the screen printer.

An error of the stencil mask is defined as following formula, and the x, y offset value and the rotating amount of a stencil mask is estimated to minimize the defined error during the process of estimating the x, y offset value and the rotating amount of a stencil mask.

(Herein, E means an error of the stencil mask, and i means each pad.)

A weight corresponding to a reliability of a measured value of the solder is applied during the process of defining the error of the stencil mask.

In one embodiment of the present invention, a method of correcting a screen printer comprises receiving fiducial information from a screen printer, dividing the board into plurality of blocks, and estimating an x, y offset value and a rotating amount for each block based on the fiducial information by the solder paste inspection apparatus, estimating an x, y offset value and a rotating amount of a stencil mask based on the estimated x, y offset value and rotating amount for each block, and transmitting the x, y offset value and the rotating amount of the stencil mask to the screen printer.

The x, y offset value and the rotating amount for each block may be estimated by using at least one of a median value of each block, a position value of the pad and the solder for each block, and a random position value for each block.

The x, y offset value and the rotating amount of the stencil mask may be estimated by averaging the x, y offset value and the rotating amount of the blocks.

In another embodiment of the present invention, a method of correcting a screen printer comprises conveying a board on which a solder is printed from a screen printer to a solder paste inspection apparatus, inspecting the conveyed board, and analyzing the inspection result by the solder paste inspection apparatus, transmitting the analyzed inspection result to the screen printer, and receiving a corrected printing condition from the screen printer by using the analyzed inspection result.

In one embodiment, the method of correcting a screen printer may further comprise displaying the corrected printing condition so that a user recognizes the correction after receiving a corrected printing condition.

In one embodiment, the method of correcting a screen printer may further comprise analyzing a relationship between the analyzed inspection result and the corrected printing condition after receiving the corrected printing condition.

In one embodiment, the corrected printing condition includes at least one of a printing pressure, a printing speed of the screen printer, and a correction of a stencil mask position.

In another embodiment of the present invention, a board inspection system comprises an inspection result transmitting part which receives a board from a screen printer that forms a solder on the board, inspects the formed solder and analyzing the inspection result, and transmits the analyzed inspection result to the screen printer, and a printing condition storing part which receives and stores a printing condition corrected in the screen printer by using the analyzed inspection result.

In one embodiment, the board inspection system may further comprise a displaying part which displays the corrected printing condition so that a user recognizes the correction.

In one embodiment, the board inspection system may further comprise an analyzing part which analyzes a relationship between the analyzed inspection result and the corrected printing condition.

For example, the corrected printing condition includes at least one of a printing pressure, a printing speed of the screen printer, and a correction of a stencil mask position.

Advantageous Effects

Thus, a method of correcting a screen printer according to the present invention may increase a reliability of solder forming process by correcting a position of a stencil mask by transmitting a feedback of an x,y offset value and a rotating amount of the stencil mask from a solder paste inspection apparatus, in which the x,y offset value and the rotating amount are estimated based on fiducial information transmitted from the screen printer.

Also, a reliability of correcting a position of a stencil mask is increased through estimating entire x,y offset value and rotating amount of the stencil mask by dividing a board into plurality of blocks, estimating an x,y offset value and a rotating amount for each block, and using them.

Also, a statistical analysis of a printing condition change and a changed printed board is available by receiving a corrected printing condition of screen printer from a solder paste inspection apparatus through using the inspection result, and therefore, it is possible to facilitate an analysis of which process to apply in order to optimize the process.

DESCRIPTION OF DRAWINGS

FIG. 1 is a conceptual diagram explaining a method of correcting a screen printer according to an embodiment of the present invention;

FIG. 2 is flow chart showing a method of correcting a screen printer according to an embodiment of the present invention;

FIG. 3 is a diagram to explain a method of estimating an x, y offset value and rotating amount of stencil mask;

FIG. 4 is a flow chart showing a method of correcting a screen printer according to an another embodiment of the present invention;

FIG. 5 is a floor plan of a board divided into plurality of blocks;

FIG. 6 is a conceptual diagram explaining a method of correcting a screen printer according to an embodiment of the present invention;

FIG. 7 is flow chart showing a method of correcting a screen printer according to an embodiment of the present invention; and FIG. 8 is a block diagram showing a board inspection system according to an embodiment of the present invention.

MODE FOR INVENTION

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that, although the terms first, second, third etc. may be used herein to describe various elements, components, regions, layers and/or sections, these elements, components, and/or sections should not be limited by these terms. These terms are only used to distinguish one element, component, region, layer or section from another region, layer or section. Thus, a first element, component, or section discussed below could be termed a second element, component, or section without departing from the teachings of the present invention.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, with reference to the drawings, preferred embodiments of the present invention will be described in detail.

FIG. 1 is a conceptual diagram explaining a method of correcting a screen printer according to an embodiment of the present invention.

Referring to FIG. 1, an embodiment of the present invention relates to a correction of a position of a stencil mask used on a screen printer 100 to form a solder on a pad of a board. The screen printer 100 transmits fiducial information to a solder paste information apparatus 200 in order to inspect forming state of the solder. The solder paste inspection apparatus 200 measures position information of a solder and each pad on a coordinate system of a board based on the transmitted fiducial information, estimates an x, y offset value and a rotating amount of the stencil mask by using the measured position information of the pad and the solder, and transmits the estimated x, y offset value and rotating amount of the stencil mask to the screen printer 100. The screen printer 100 corrects a position of the stencil mask based on the received x, y offset value and the rotating amount from the solder paste inspection apparatus 200, and increases a reliability of solder forming process. Meanwhile, feedback information transmitted from the solder paste inspection apparatus 200 to the screen printer 100 may be a control command which performs a position correction of stencil mask based on an x, y offset value and a rotating amount.

FIG. 2 is flow chart showing a method of correcting a screen printer according to an embodiment of the present invention.

Referring to FIGS. 1-2, in order to correct a screen printer according to an embodiment of the present invention, a screen printer 100 transmits fiducial information related to a stencil mask used to form a solder to a solder paste inspection apparatus 200 (S100). Herein, the fiducial information may include at least one of a fiducial coordinate of a stencil mask, a coordinate matching algorithm between a board and a stencil mask, and a conversion formula of a coordinate.

A solder paste inspection apparatus 200 extracts position information of a pad formed on a board through measuring a board delivered from a screen printer 200 and solder position information formed on a board by a screen printer 100 (S110). And, the position of the pad and solder may be obtained from the measured data obtained by the solder paste inspection apparatus 200. For example, position information of each pad and a solder may be expressed in an x,y coordinate positioned at a center based on a surface or an x,y coordinate positioned at a center based on a volume.

A solder paste inspection machine 200 estimates an x,y offset value and a rotating amount of the stencil mask based on the fiducial information by using the position information of the pad and the solder (S120).

FIG. 3 is a diagram to explain a method of estimating an x,y offset value and rotating amount of stencil mask. In FIG. 3, $(x_0, y_0)$ means a coordinate system of a board, $(x_s, y_s)$ means a coordinate system of a screen printer.

Referring to FIGS. 1-3, a solder paste inspection apparatus 200 extracts positions of each pad 110 and each solder 120 on a board coordinate system $(x_s, y_s)$ which is based on the fiducial information, and calculates a solder offset (dx, dy) corresponding to the positions of the pad 110 and the solder 120 based on the extracted position information.

In FIG. 3, a conversion formula of a coordinate for coordinate matching of a board coordinate system $(x_0, y_0)$ and a screen printer coordinate system $(x_s, y_s)$ may be expressed as a Formula 1.

$$\begin{bmatrix} x_o \\ y_o \end{bmatrix} = \begin{bmatrix} \cos\theta & -\sin\theta \\ \sin\theta & \cos\theta \end{bmatrix} \begin{bmatrix} x_s \\ y_s \end{bmatrix} + \begin{bmatrix} a \\ b \end{bmatrix} \quad \text{[Formula 1]}$$

$$= \begin{bmatrix} p & -q \\ q & p \end{bmatrix} \begin{bmatrix} x_s \\ y_s \end{bmatrix} + \begin{bmatrix} a \\ b \end{bmatrix}$$

where $p = \cos\theta$, $q = \sin\theta$

The solder offset (dx,dy) may be expressed as Formula 2 by referring to the Formula 1.

$$dx = x_p - x_r(px_r - qy_r + a) - x_r$$

$$dy = y_p - y_r(qx_r + py_r + b) - x_r \quad \text{[Formula 2]}$$

Meanwhile, an error of stencil mask during estimating the x,y offset value of the stencil mask may be defined as Formula 3.

$$E = \sum_i (\text{position of measured solder} - \quad \text{[Formula 3]}$$

$$\text{estimated opening position of stencil mask})^2$$

(Herein, E means an error of the stencil mask, and i means each pad.)

The Formula 3 may be expressed as Formula 4 by referring the Formula 2.

$$E = \sum_i [((x_{pi} - (px_{ri} - qy_{ri} + a))^2 + ((y_{pi} - (qx_{ri} + py_{ri} + b))^2] \quad \text{[Formula 4]}$$

Herein, a solder paste inspection apparatus 200 estimates an x,y offset value (a,b) and a rotation amount θ of the stencil mask minimizing the defined error E.

For example, the offset value (a,b) and the rotation amount θ of the stencil mask may be calculated by a Formula 5 which expresses a Partial derivatives for each parameter (a,b,p,q) for the error E.

$$\frac{\partial E}{\partial p} = 0 = \sum (x_{pi} - (px_{ri} - qy_{ri} + a)) \cdot (-x_{ri}) + \quad \text{[Formula 5]}$$

$$\sum (y_{pi} - (qx_{ri} + py_{ri} + b)) \cdot (-y_{ri})$$

$$\frac{\partial E}{\partial p} = 0 = \sum (x_{pi} - (px_{ri} - qy_{ri} + a)) \cdot (y_{ri}) +$$

$$\sum (y_{pi} - (qx_{ri} + py_{ri} + b)) \cdot (-x_{ri})$$

$$\frac{\partial E}{\partial a} = 0 = \sum (x_{pi} - (px_{ri} - qy_{ri} + a))$$

$$\frac{\partial E}{\partial b} = 0 = \sum (y_{pi} - (qx_{ri} + py_{ri} + b))$$

A solder paste inspection apparatus 200 estimates the x,y offset value (a,b) and the rotation amount θ of the stencil mask by using the Formulas 1 to 4, and transmits the estimated x,y offset value (a,b) and the rotation amount θ of the stencil mask as feedback information to a screen printer 100 (S130).

Meanwhile, a weight is applied when defining the error E of the stencil mask as shown in Formula 6, and a reliability of the feedback information is increased. Herein, the weight may be a reliability of a measured value of the solder, for example, the weight may include a visibility of the measured value of the solder.

$$E = \quad \text{[Formula 6]}$$

$$\sum_i w_i [((x_{pi} - (px_{ri} - qy_{ri} + a))^2 + ((y_{pi} - (qx_{ri} + py_{ri} + b))^2]$$

(Herein, i means each pad, $W_i$ means a weight for each pad.)

Then, a position of the stencil mask is corrected based on the feedback information which are the estimated x,y offset value (a,b) and the rotation amount θ of the stencil mask (S140).

The correction process shown in FIG. 3 may be repeatedly performed until the error of a solder printing of a screen printer 100 and a solder paste inspection apparatus 200 is minimized, and a reliability of a solder printer 100 is increased by consistently monitoring.

Meanwhile, an x,y scale correction is available when two fiducials are used in a screen printer 100 and a solder paste inspection apparatus 200, a skew of the stencil mask is precisely corrected by using three fiducials. Herein, the additional third fiducial coordinate except for the two existing fiducial coordinates may be obtained from geber data or geber data of a board.

Thus, a reliability of a solder printer 100 is increased by estimating an x,y offset value (a,b) and a rotation amount θ of the stencil mask and performing correction of the stencil mask by transmitting the estimated data as feedback information to a screen printer 100.

FIG. 4 is a flow chart showing a method of correcting a screen printer according to an another embodiment of the present invention, and FIG. 5 is a floor plan of a board divided into plurality of blocks.

Referring to FIGS. 1,4, and 5, in order to correct a screen printer according to an embodiment of the present invention, a screen printer 100 transmits fiducial information related to a stencil mask used to form a solder to a solder paste inspection apparatus 200 (S200).

A solder paste inspection apparatus 200 divides a board 300 delivered from a screen printer 100 into plurality of blocks 310, and estimates an x,y offset value and a rotation amount for each block based on the fiducial information (S210). In other words, a solder paste inspection apparatus 200 divides the board 300 into plurality of blocks 310, extracts a specific arbitrary position for each block 310, and estimates an x,y offset value and a rotation amount for each block based on the fiducial information. Herein, the specific arbitrary position may include at least one of a median value for each block, a position value of each pad and solder, and an arbitrary position for each block. A solder paste inspection apparatus 200 may preferably estimate an x,y offset value and a rotation amount for each block by using at least more than two position values among the position values for each block mentioned above. Estimating the x,y offset value and the rotation amount for each block may use the same method which is explained referring to Formulas 1 to 4, and duplicated explanations are omitted.

A solder paste inspection apparatus 200 estimates an x,y offset value of the stencil mask based on the estimated x,y offset value and rotation amount for each block 310 (S220). For example, a solder paste inspection apparatus 200 estimates the x,y offset value and the rotation amount of the stencil mask, which indicates a degree of an error, by averaging the estimated x,y offset value and rotation amount for each block 310.

A solder paste inspection apparatus 200 transmits feedback information, which are the estimated x,y offset value and rotation amount of the stencil mask, to a screen printer 100 after estimating the x,y offset value and the rotation amount of the stencil mask (S230).

A screen printer 100 corrects a stencil mask position based on the x,y offset value and the rotation amount of the stencil mask (S240).

Thus, a reliability of a solder printer 100 is increased by dividing a board 300 into plurality of blocks 300 and estimating an x,y offset value and a rotation amount for each block, and performing correction of the stencil mask by transmitting the estimated data as feedback information to a screen printer 100, and estimating an x,y offset value and a rotation amount of the stencil mask using them.

FIG. 6 is a conceptual diagram explaining a method of correcting a screen printer according to an embodiment of the present invention.

Referring to FIG. 6, in order to form a solder on a board according to an embodiment of the present invention, a screen printer 400 exchanges information with a solder paste inspection apparatus 500 which inspects a solder forming state.

In more detail, first, a solder paste inspection apparatus 500 inspects and analyzes a solder forming state, and a screen printer 400 receives the analyzed result, corrects a printing condition, and transmits the corrected printing condition to the solder paste inspection apparatus 500.

FIG. 7 is flow chart showing a method of correcting a screen printer according to an embodiment of the present invention.

Referring to FIGS. 6 and 7, a method of correcting a screen printer according to an embodiment of the present invention is performed as below.

First, a screen printer 400 delivers a board 300 on which a solder is formed to a solder paste inspection apparatus 500 (S300).

The screen printer 400 forms a solder on a pad of the board under specific condition. Then, the board is delivered to the solder paste inspection apparatus 500 after forming the solder.

Next, the solder paste inspection apparatus 500 inspects the delivered board 300 and analyzes the inspection result (S310).

In more detail, the solder paste inspection apparatus 500 inspects the board by measuring 2 or 3 dimensional image such as a volume or a shape of a solder, and analyzes whether the solder is defective. Herein, the correction of the solder paste position is determined based on the value of the pad and the solder. Next, the solder paste inspection apparatus 500 transmits the analyzed result to the screen printer 400 (S320), and corrects the printing condition of the screen printer based on the analyzed result (S330).

The printing condition of the screen printer 400 may be corrected when the analysis result is determined "NO GOOD". The printing condition of the screen printer 400 may not be corrected when the analysis result is determined "GOOD". Alternatively, the printing condition of the screen printer 400 may be corrected when the degree of "GOOD" is unsatisfactory.

In one embodiment, the printing condition may include at least one of a printing pressure, a printing speed, and a position correction of stencil mask of the screen printer 400.

The corrected printing condition may be displayed so that a use is capable of recognizing after correcting the printing condition. For example, an icon for the corrected printing condition may be generated so that a user is easily capable of recognizing the correction.

Next, the corrected printing condition is transmitted to the solder paste inspection apparatus (S340), and the corrected printing condition is stored (S350).

A relationship between the corrected printing condition according to the inspection result and the inspection result of the solder paste inspection apparatus may be analyzed after storing the corrected printing condition (S360).

In more detail, it is possible to review a record of how an improved result of a printing condition is obtained, and what condition revision and which process has brought about an improved result by receiving feedback information from the solder paste inspection apparatus 500, the feedback information is the corrected printing condition of the screen printer 400 which is corrected by using the inspection result of the solder paste inspection apparatus 500, and therefore, a statistical analysis is available by using them. Also, an analysis of which process to be applied to optimize may be performed.

The method of correcting a screen printer according to an embodiment of the present invention described above may be specified in a board inspection system followed below.

FIG. 8 is a block diagram showing a board inspection system according to an embodiment of the present invention.

Referring to FIG. 8, a board inspection system 1000 according to an embodiment of the present invention includes a screen printer 400 and a solder paste inspection apparatus 500.

The screen printer 400 forms a solder on a board.

The solder paste inspection apparatus 500 receives the board from the screen printer 400, inspects the formed solder, and analyzes the inspection result.

In more detail, the solder paste inspection apparatus 500 inspects the board by measuring 2 or 3 dimensional image such as a volume or a shape of a solder, and analyzes whether the solder is defective.

The solder paste inspection apparatus 500 includes an inspection result transmitting part 510 which transmits the analyzed inspection result to the screen printer.

The screen printer 400 includes a printing condition correcting part 410 and a corrected printing condition transmitting part 420.

The printing condition correcting part 410 corrects the printing condition of the screen printer 400 by using the analyzed inspection result.

When the inspection result is determined "NO GOOD", the printing condition of the screen printer 400 may be corrected. When the inspection result is determined "GOOD", the printing condition of the screen printer 400 may not be corrected. Alternatively, the printing condition of the screen printer 400 may be corrected when the degree of "GOOD" is unsatisfactory.

In one embodiment, the printing condition may include at least one of a printing pressure, a printing speed, and a position correction of stencil mask of the screen printer 400.

The corrected printing condition transmitting part 420 transmits the corrected printing condition to the solder paste inspection apparatus 500.

The solder paste inspection apparatus 500 further includes a printing condition storing part 520 which stores the corrected printing condition.

In more detail, it is possible to review a record of how an improved result of a printing condition is obtained, and what condition revision and which process has brought about an improved result by receiving feedback information from the solder paste inspection apparatus 500, the feedback information is the corrected printing condition of the screen printer 400 which is corrected by using the inspection result of the solder paste inspection apparatus 500, and therefore, a statistical analysis is available by using them. Also, an analysis of which process to be applied to optimize may be performed.

In one embodiment, the solder paste inspection apparatus 500 may further include a display part 530 which interfaces and displays the corrected printing condition. Thus, the display part 530 receives and displays the corrected printing condition from the printing condition storing part 520, in one embodiment, an icon for the corrected printing condition may be generated so that a user is easily capable of recognizing the correction.

In one embodiment, the board inspection system 1000 may further include an analyzing part (not shown) which analyzes relationship between the inspection result of the solder paste inspection apparatus 500 and the corrected printing condition according to the inspection result. The analyzing part may be included in the solder paste inspection apparatus 500. Alternatively, the analyzing part may be included in a control part (not shown) which communicates with the screen printer 400 and the solder paste inspection apparatus 500. The control part may be a computer system. Also, the control part may send and control instructions between the screen printer 400 and the solder paste inspection apparatus 500.

Meanwhile, all or part among the printing condition correcting part 410 and a corrected printing condition transmitting part 420 and all or part among the inspection result transmitting part 510, the printing condition storing part 520, and the display part 530 may be included apart from the screen printer 400 and the solder paste inspection apparatus 500. Herein, the control part include all or part among the printing condition correcting part 410 and a corrected printing condition transmitting part 420 of the screen printer 400 and all or part among the inspection result transmitting part 510, the printing condition storing part 520, and the displaying part 530 of the solder paste inspection apparatus 500.

According to an embodiment of the present invention described above, a reliability of a correction of a stencil mask position may be further increased by dividing the board into plurality of blocks and estimating an x,y offset value and a rotation amount for each block, and estimating an x,y offset value and a rotation amount of the stencil mask.

Also, a statistical analysis is available by receiving feedback information from the solder paste inspection apparatus 500, the feedback information is the corrected printing condition of the screen printer 400 which is corrected by using the inspection result of the solder paste inspection apparatus 500, and therefore, a statistical analysis is available by using them. Also, an analysis of which process to be applied to optimize may be performed.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

The invention claimed is:

1. A method of estimating offset values in a stencil mask for correcting a screen printer configured to deliver a board, the method comprising:
    partitioning the board into plurality of blocks in a computer processing environment, by a solder paste inspection apparatus, wherein the board consists of the plurality of blocks;
    obtaining a position of each of a plurality of pads and a position of each of a plurality of solders formed on the board for each block on a coordinate system of the board, by a solder paste inspection apparatus;
    estimating one block-x, y offset values for each block and one block-rotating amount for each block from the positions of the pads and the positions of the solders for minimizing distances between the positions of the pads and the positions of the solders by coordinate matching between the coordinate system of the board and a coordinate system of the screen printer, by the solder paste inspection apparatus;
    estimating one x, y offset value and one rotating amount of a stencil mask based on the estimated block-x, y offset values for blocks and block-rotating amounts for blocks, by the solder paste inspection apparatus; and
    transmitting the estimated x, y offset value and the estimated rotating amount of the stencil mask from the solder paste inspection apparatus to the screen printer; and
    correcting a printing condition of the screen printer based on the estimated x, y offset value and the estimated rotating amount of the stencil mask.

2. The method of claim 1, wherein the x, y offset value and the rotating amount of the stencil mask are estimated by averaging the x, y offset value and the rotating amount of each block.

3. The method of claim 1, when estimating the block-x, y offset value and the block-rotating amount of the stencil mask, wherein the error of the stencil mask is defined as following formula:

$$E = \sum_i (\text{position of measured solder} - \text{estimated opening position of stencil mask})^2$$

wherein E means the error of the stencil mask, and i means each pad, and the block-x, y offset value and the block-rotating amount of the stencil mask are estimated to minimize the defined error.

4. The method of claim 3, wherein a weight corresponding to a reliability of a measured value of a solder is applied in defining the error of the stencil mask.

5. The method of claim 1, before dividing a board into plurality of blocks in a computer processing environment, by a solder paste inspection apparatus, further comprising receiving fiducial information from a screen printer, by the solder paste inspection apparatus, wherein the coordinate system of the board is based on the fiducial information.

6. A method of estimating offset values in a stencil mask for correcting a screen printer configured to deliver a board, the method comprising:

obtaining an image of the board;

partitioning the board into plurality of blocks in a computer processing environment, by a solder paste inspection apparatus, wherein the board consists of the plurality of blocks;

obtaining a position of each of a plurality of pads and a position of each of a plurality of solders formed on the board for each block on a coordinate system of the board, by a solder paste inspection apparatus;

estimating one block-x, y offset values for each block and one block-rotating amount for each block from the positions of the pads and the positions of the solders for minimizing distances between the positions of the pads and the positions of the solders by coordinate matching between the coordinate system of the board and a coordinate system of the screen printer, by the solder paste inspection apparatus;

estimating one x, y offset value and one rotating amount of a stencil mask based on the estimated block-x, y offset values for blocks and block-rotating amounts for blocks, by the solder paste inspection apparatus;

transmitting the estimated x, y offset value and the estimated rotating amount of the stencil mask from the solder paste inspection apparatus to the screen printer; and correcting a printing condition of the screen printer based on the estimated x, y offset value and the estimated rotating amount of the stencil mask, wherein the partitioning the image of the board into a plurality of blocks follows the obtaining the image of the board.

* * * * *